United States Patent
Shindo et al.

(10) Patent No.: US 9,920,426 B2
(45) Date of Patent: Mar. 20, 2018

(54) METHOD FOR PRODUCING LITHIUM PHOSPHORUS OXYNITRIDE LAYER

(71) Applicant: Toyota Jidosha Kabushiki Kaisha, Toyota-shi, Aichi-ken (JP)

(72) Inventors: Yohei Shindo, Susono (JP); Taishi Shiotsuki, Susono (JP); Hideyuki Koga, Susono (JP); Maarit Karppinen, Espoo (FI); Mikko Nisula, Espoo (FI)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 15 days.

(21) Appl. No.: 15/255,714

(22) Filed: Sep. 2, 2016

(65) Prior Publication Data
US 2017/0067161 A1 Mar. 9, 2017

(30) Foreign Application Priority Data
Sep. 4, 2015 (JP) ................. 2015-175070

(51) Int. Cl.
*C23C 16/455* (2006.01)
*H01M 10/0562* (2010.01)
*H01M 10/0525* (2010.01)
*C23C 16/30* (2006.01)

(52) U.S. Cl.
CPC ...... *C23C 16/45553* (2013.01); *C23C 16/308* (2013.01); *C23C 16/45555* (2013.01); *H01M 10/0525* (2013.01); *H01M 10/0562* (2013.01)

(58) Field of Classification Search
None
See application file for complete search history.

(56) References Cited

U.S. PATENT DOCUMENTS

2017/0005365 A1* 1/2017 Nakai ................. H01M 10/052

OTHER PUBLICATIONS

Biqiong Wang et al., "Atomic Layer Deposition of Lithium Phosphates as Solid-State Electrolytes for All-Solid-State Microbatteries", NanoTechnology, Nov. 28, 2014, vol. 25, No. 50, IOP Publishing Ltd.
Alexander C. Kozen et al., "Atomic Layer Deposition of the Solid Electrolyte LiPON", Chem. Mater., Jul. 9, 2015, 27 (15), pp. 5324-5331.

* cited by examiner

*Primary Examiner* — Joseph A Miller, Jr.
(74) *Attorney, Agent, or Firm* — Dinsmore & Shohl LLP

(57) ABSTRACT

A method for producing a lithium phosphorus oxynitride layer having high ionic conductivity is provided. The method for producing a lithium phosphorus oxynitride layer on a substrate by atomic layer deposition comprises an atmosphere interchanging step, wherein the atmosphere surrounding the substrate is alternately switched between a first atmosphere, containing a first precursor such as a dialkyl phosphoramidate and/or alkyl phosphorodiamidate, and a second atmosphere, containing a second precursor such as a lithium hexaalkyl disilazide.

20 Claims, 2 Drawing Sheets

METHOD FOR PRODUCING LITHIUM PHOSPHORUS OXYNITRIDE LAYER

CROSS-REFERENCE TO RELATED APPLICATIONS

This application claims priority to Japanese Patent Application No. 2015-175070 filed on Sep. 4, 2015, the entire contents of which is hereby incorporated by reference.

TECHNICAL FIELD

The present disclosure relates to a method for producing a lithium phosphorus oxynitride layer. More particularly, the present disclosure relates to a method for producing a lithium phosphorus oxynitride layer having high ionic conductivity.

BACKGROUND ART

All-solid-state batteries, in which the liquid electrolyte has been replaced with a solid electrolyte, have attracted attention in recent years. In comparison with secondary batteries using a liquid electrolyte, all-solid-state batteries, which do not use a liquid electrolyte, demonstrate both high cycle durability and energy density without undergoing decomposition of the electrolyte caused by overcharging the battery.

An example of the structure of an all-solid-state battery may be composed of a structure in which a positive electrode current collector layer, a positive electrode active material layer, a solid electrolyte layer, a negative electrode active material layer, and a negative electrode current collector layer are laminated. In general, it is preferable, in order to improve the energy density and performance thereof, that an amount of active material in the all-solid-state battery is large; and that the thickness of the solid electrolyte layer is as thin as possible. In particular, if the thickness of the solid electrolyte layer is able to be reduced, a correspondingly larger amount of active material can be contained in the all-solid-state battery.

However, in the case of having reduced the thickness of the solid electrolyte layer, there is an increased likelihood, for example, of the formation of pinholes and the like in a portion of the solid electrolyte layer, depending on the production conditions and the like of the solid electrolyte layer. Thus, studies have been conducted on methods for producing a solid electrolyte layer that is able to inhibit the formation of pinholes and the like while reducing thickness.

Regarding the method for producing, as a solid electrolyte layer for an all-solid-state microbattery, a lithium phosphate layer by atomic layer deposition, Non-Patent Document 1 (Biquiong Wang, Jian Liu, Qian Sun, Ruying Li, Tsun-Kong Sham and Xueliang Sun, "Atomic layer deposition of lithium phosphates as solid-state electrolytes for all-solid-state", Nanotechnology, 2014, Vol. 25, No. 50) discloses a technology for forming a lithium phosphate layer on a substrate by alternately switching the atmosphere surrounding the substrate between a first atmosphere, containing a first precursor in the form of trimethyl phosphate, and a second atmosphere, containing a second precursor in the form of lithium tert-butoxide.

SUMMARY

In the method of Non-Patent Document 1 for producing, as a solid electrolyte layer for an all-solid-state microbattery, a lithium phosphate layer by atomic layer deposition, the formation of pinholes is attempted to be inhibited while reducing thickness of a lithium phosphate layer as a solid electrolyte layer, by forming a pinhole-free lithium phosphate layer on a substrate at the single layer level. However, the ionic conductivity of lithium phosphate is comparatively low.

Thus, an object of the present disclosure is to provide a method for producing a lithium phosphorus oxynitride layer having high ionic conductivity.

A method for producing a lithium phosphorus oxynitride layer on a substrate by atomic layer deposition is provided. In embodiments, the method includes an atmosphere interchanging step wherein the atmosphere surrounding the substrate is alternately switched between a first atmosphere, containing a first precursor, and a second atmosphere, containing a second precursor. The first precursor is at least one selected from the group consisting of molecules represented by the following structural formula (I-1) and (I-2), and the second precursor is at least one selected from the group consisting of an organic lithium amide molecule, an alkyl lithium molecule, and a lithium alkoxide molecule:

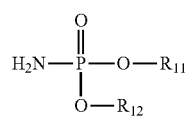

Structural Formula (I-1)

(wherein, $R_{11}$ and $R_{12}$ represent alkyl groups);

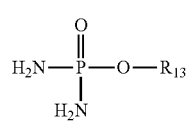

Structural Formula (I-2)

(wherein, $R_{13}$ represents as alkyl group). In embodiments, each of $R_{11}$ and $R_{12}$ in the structural formula (I-1) and $R_{13}$ in structural formula (I-2) independently represent a methyl group, an ethyl group, a propyl group, a butyl group, or a pentyl group. In some embodiments, each of $R_{11}$ and $R_{12}$ in the structural formula (I-1) represent an ethyl group. The second precursor may be at least one molecule selected from the group consisting of molecules represented by the following structural formula (II), lithium tert-butoxide, lithiodicyclohexylamine, 2,2,6,6-tetramethyl-3,5-heptanedionato lithium, and lithium cyclopentadienide wherein, $R_{21}$, $R_{22}$, $R_{23}$, $R_{24}$, $R_{25}$, and $R_{26}$ represent alkyl groups.

Structural Formula (II)

$$R_{25}-\underset{\underset{R_{26}}{|}}{\overset{\overset{R_{24}}{|}}{Si}}-\underset{\underset{Li}{|}}{N}-\underset{\underset{R_{23}}{|}}{\overset{\overset{R_{21}}{|}}{Si}}-R_{22}$$

In some embodiments, the first precursor is the molecules represented by the structural formula (I-1), and the second precursor is the molecules represented by the structural formula (II). In embodiments, each of $R_{21}$, $R_{22}$, $R_{23}$, $R_{24}$, $R_{25}$, and $R_{26}$ in the structural formula (II) independently represent a methyl group, an ethyl group, a propyl group, a butyl group, or a pentyl group. In some embodiments, each of $R_{21}$, $R_{22}$, $R_{23}$, $R_{24}$, $R_{25}$, and $R_{26}$ in the structural formula (II) represent a methyl group. The temperature of the substrate may be between about 250° C. to about 350° C. and the atmosphere surrounding the substrate is made to be an inert gas atmosphere during the time of switching between the first atmosphere and the second atmosphere.

Accordingly, a method can be provided for producing a lithium phosphorus oxynitride layer having high ionic conductivity.

DETAILED DESCRIPTION

Figure 1:
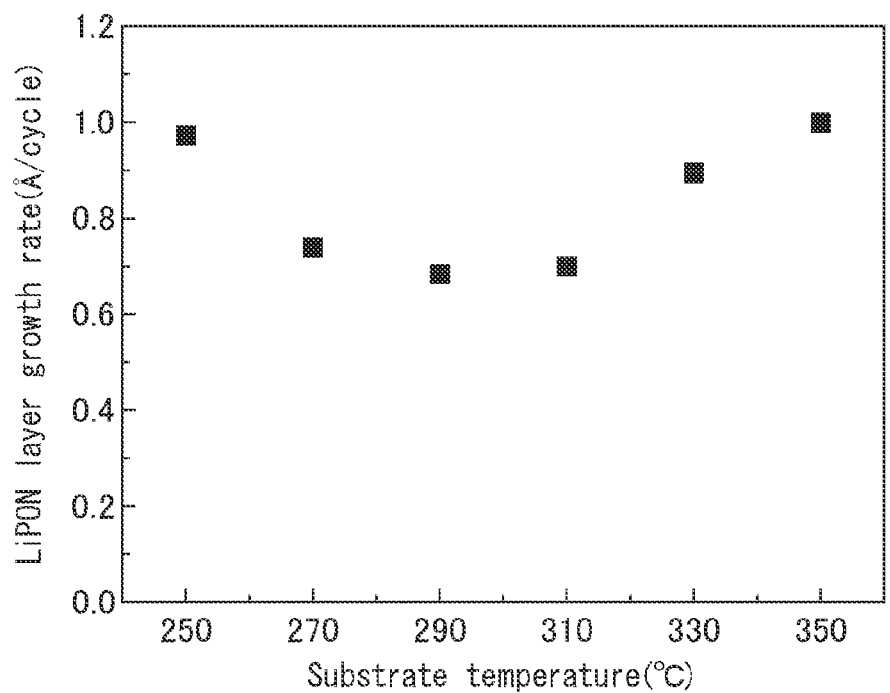
FIG. 1 is a graph showing the relationship between the temperature (° C.) of a substrate and the growth rate (Å/cycle) of a lithium phosphorus oxynitride layer (LiPON layer) according to one or more embodiments disclosed herein.

The following provides a detailed explanation of embodiments of the present disclosure. Furthermore, the present disclosure is not limited to the following embodiments, and can be carried out by making various modifications within the scope of the gist of the present disclosure.

In the present disclosure, a "lithium phosphorus oxynitride layer" (also referred to as a "LiPON layer") has a structure in which the oxygen element in lithium phosphate is partially substituted with nitrogen atoms, and the lithium phosphate contains lithium (Li), phosphorus (P), oxygen (O), and nitrogen (N), for example at a ratio of 0.90:1:2.75:0.55.

In the present disclosure, an "organic lithium amide molecule" refers to an organic-based molecule represented by formula Li—$N(R)_2$ or formula Li—$N(SiR_3)_2$, an "alkyl lithium molecule" refers to a molecule having Li—R structure, and a "lithium alkoxide molecule" refers to a molecule having Li—O—R structure. Furthermore, the aforementioned "R" refers to any alkyl groups, such as a methyl group, an ethyl group, a propyl group, a butyl group or a pentyl group.

<<Method for Producing Lithium Phosphorus Oxynitride Layer>>

The method of the present disclosure for producing a lithium phosphorus oxynitride layer on a substrate by atomic layer deposition comprises an atmosphere interchanging step wherein the atmosphere surrounding the substrate is alternately switched between a first atmosphere containing a first precursor and a second atmosphere containing a second precursor.

Atomic layer deposition is a method for depositing atomic layers one at a time typically, by repeating a cycle being composed of (1) introducing a precursor, (2) purging, (3) introducing a different precursor, and (4) purging. According to this method, a layer that is free of pinholes, is conformal, and demonstrates accuracy at the single layer level, can be formed on a nanostructure having a high aspect ratio. Furthermore, "aspect ratio" typically means the ratio between the length or height and width.

According to one embodiment of the method of the present disclosure, the atmosphere surrounding a substrate, for example, is made to be a first atmosphere containing a first precursor. As a result, a reaction occurs between atoms or molecules constituting the surface of the substrate and the first precursor, the first precursor is spread over the surface of the substrate without essentially any gaps between first precursor molecules, and a layer of the first precursor is formed on the surface of the substrate. At this time, since a plurality of the first precursor molecules do not mutually react, there is hardly any deposition of a different first precursor on the layer of first precursor that present on the surface of the substrate (i.e., the first precursor is self-limiting).

The atmosphere surrounding the substrate having a layer of the first precursor formed thereon is then switched to a second atmosphere containing a second precursor. As a result, a reaction occurs between the second precursor and the first precursor, the second precursor is spread over the surface of the layer of the first precursor without essentially any gaps between second precursor molecules, and a layer of the second precursor is formed on the layer of the first precursor. At this time, since a plurality of the second precursor molecules do not mutually react, there is hardly any deposition of a different second precursor on the layer of second precursor (i.e., the second precursor is self-limiting).

It is appreciated that in atomic layer deposition, as a result of the first and second precursors having the property of self-limiting, reactions by which layers are formed can be precisely controlled. Moreover, by repeating interchange of the first and second atmospheres for a plurality of times, layer thickness can also be precisely controlled. Consequently, as a result of going through the aforementioned step, a layer that is free of pinholes, is conformal, and demonstrates accuracy at the single layer level, can be formed on the surface of a substrate.

Furthermore, there are no particular limitations on the order in which the first atmosphere containing the first precursor or the second atmosphere containing the second precursor is introduced.

<Precursors>

In embodiments of the method of the present disclosure for producing a lithium phosphorus oxynitride layer on a substrate by atomic layer deposition, the first precursor is at least one selected from the group consisting of molecules represented by the following structural formula (I-1) and (I-2), and the second precursor is at least one selected from the group consisting of an organic lithium amide molecule, an alkyl lithium molecule, and a lithium alkoxide molecule:

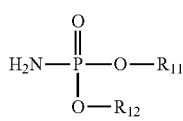

Structural Formula (I-1)

(wherein, $R_{11}$ and $R_{12}$ represent alkyl groups);

Structural Formula (I-2)

(wherein, $R_{13}$ represent alkyl groups).

In the past, a technology for producing a nitride using $NH_3$ has been employed in atomic layer deposition. The conditions for producing a lithium phosphorus oxynitride layer on a substrate, using trimethyl phosphate (($CH_3)_3PO_4$) as a precursor, ammonium ($NH_3$) as a precursor, and a lithium source and the like were examined. Namely, a reaction in which $NH_3$ is allowed to nucleophilically attack the P atom of $(CH_3)_3PO_4$, thereby cleaving the P—O bonds and resulting in the formation of P—N bonds was attempted.

However, there was hardly any occurrence of the aforementioned reaction. Although not limited by any theory, this is believed to be due to $NH_3$ preferentially nucleophilically attacking the $CH_3$ groups of $(CH_3)_3PO_4$. The reaction mechanism is indicated in FIG. 3.

Figure 3:
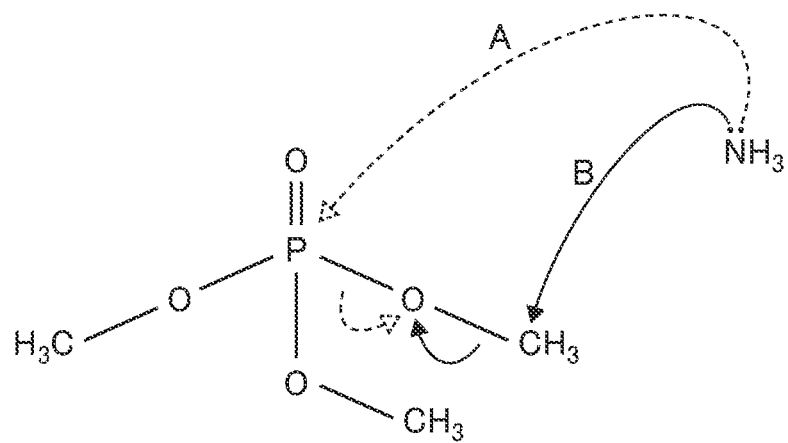
FIG. 3 is a drawing showing an intended reaction mechanism A and a presumed reaction mechanism B regarding atomic layer deposition using a precursor in the form of $(CH_3)_3PO_4$ and a precursor in the form of $NH_3$.

FIG. 3 is a drawing showing an intended reaction mechanism A and a presumed reaction mechanism B regarding atomic layer deposition using a precursor in the form of $(CH_3)_3PO_4$ and a precursor in the form of $NH_3$.

The present disclosure provides a solution to the problem by employing the first precursor having P—N bonds (represented by the aforementioned structural formula (I-1) and/or structural formula (I-2)), and the second precursor containing lithium-donating organic lithium amide molecule and the like.

Namely, by employing a first precursor containing a molecule having P—N bonds, it is no longer necessary to form P—N bonds between $(CH_3)_3PO_4$ and $NH_3$, and by further employing a second precursor containing an organic lithium amide molecule and the like, elemental Li can be supplied, whereby it is possible to form a lithium phosphorus oxynitride layer both easily and selectively.

The molecules represented by the aforementioned structural formula (I-1) and (I-2), are also referred to as dialkyl phosphoramidate and alkyl phosphorodiamidate respectively. The content of N elemental can be controlled by using those molecules properly, when a lithium phosphorus oxynitride layer is formed. Although not limited by any theory, a ratio of N elemental to P elemental in a lithium phosphorus oxynitride layer can be modified to improve ionic conductivity.

In addition, examples of the second precursor may include an organic lithium amide molecule, an alkyl lithium molecule, a lithium alkoxide molecule, and combination thereof. These moleculars can accelerate the reaction, since lithium-donating performance of those molecules is comparatively high. Moreover, it is possible to control the vapor pressure of those molecules by selecting independently alkyl groups thereof, such as a methyl group, an ethyl group, a propyl group, a butyl group, or a pentyl group. Thus, the vapor pressure of those molecules can be increased, so as to further improve reactivity thereof.

Thus, in embodiments of the method of the present disclosure for producing a lithium phosphorus oxynitride layer on a substrate by atomic layer deposition, a lithium phosphorus oxynitride layer that is free of pinholes, is conformal, and demonstrates accuracy at the single layer level, can be formed on the surface of a substrate. In addition, the lithium phosphorus oxynitride layer produced according to embodiments of the method of the present disclosure is provided with preferred properties such as high ionic conductivity, low electronic conductivity, and chemical stability, and may be preferably employed in batteries, in particular, 3D micro-batteries, all-solid-state batteries or all-solid-state micro-batteries.

Furthermore, examples of a molecule which is similar to dialkyl phosphoramidate and alkyl phosphorodiamidate, may include phosphoric triamide ($OP(NH_2)_3$). In the case of carrying out atomic layer deposition by using a first precursor containing phosphoric triamide; and a second precursor containing an organic lithium amide molecule and the like, the formation of P—O—Li bonds may be inhibited. Although not limited by any theory, it is believed that, since phosphoric triamide does not have an alkoxy group (—OR) unlike the two molecules of the aforementioned amidate molecules, the formation of O—Li bonds is inhibited.

In embodiments of the method of the present disclosure for producing a lithium phosphorus oxynitride layer on a substrate by atomic layer deposition, the second precursor is at least one selected from the group consisting of a molecules represented by the following structural formula (II), lithiodicyclohexylamine, lithium tert-butoxide, 2,2,6,6-tetramethyl-3,5-heptanedionato lithium, and lithium cyclopentadienide.

Structural Formula (II)

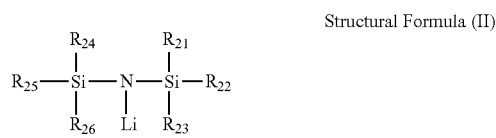

(wherein, $R_{21}$, $R_{22}$, $R_{23}$, $R_{24}$, $R_{25}$, and $R_{26}$ represent alkyl groups).

It is possible to control nucleophilicity and/or vapor pressure of the above molecules by selecting alkyl groups such as the a methyl group, an ethyl group, a propyl group, a butyl group, and a pentyl group. As a result, when a lithium phosphorus oxynitride layer is formed, the reaction for forming P—O—Li bonds can be accelerated by supplying elemental Li efficiently.

In addition, the molecule represented by the aforementioned structural formula (II) (also referred to as lithium hexaalkyl disilazide) may be preferable in embodiments of the method of the present disclosure, from the viewpoints of reactivity and vapor pressure.

Furthermore, structural formula of lithiodicyclohexylamine, lithium tert-butoxide, 2,2,6,6-tetramethyl-3,5-heptanedionato lithium, and lithium cyclopentadienide are shown in the following (1) to (4), respectively.

(1)

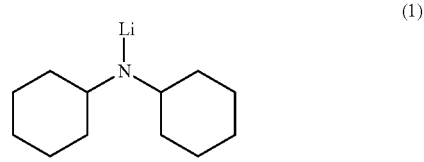

(2)

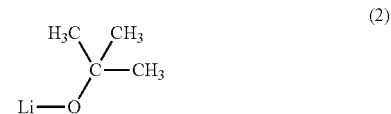

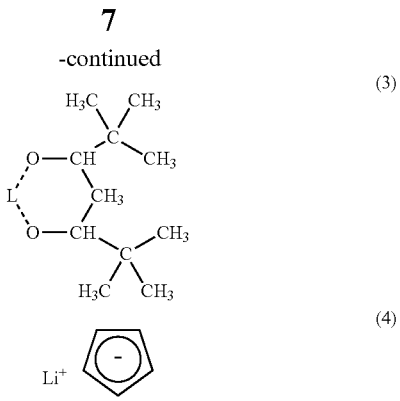

(3)

(4)

In embodiments of the method of the present disclosure for producing a lithium phosphorus oxynitride layer on a substrate by atomic layer deposition, $R_{11}$ and $R_{12}$ in structural formula (I-1) and $R_{13}$ in structural formula (I-2), and each of $R_{21}$, $R_{22}$, $R_{23}$, $R_{24}$, $R_{25}$, and $R_{26}$ in structural formula (II) may independently represent a methyl group, an ethyl group, a propyl group, a butyl group, or a pentyl group.

The use of these groups makes it easier to control steric bulk, handleability, reactivity and the like of the precursors.

In embodiments of the method of the present disclosure for producing a lithium phosphorus oxynitride layer on a substrate by atomic layer deposition, preferably, each of $R_{11}$ and $R_{12}$ in the molecule represented by structural formula (I-1) as a the first precursor, is an ethyl group. The molecular is represented by the following structural formula.

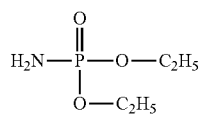

The first precursor represented by the aforementioned structural formula is so-called diethyl phosphoramidate (DEPA: $H_2NP(O)(OC_2H_5)_2$). This DEPA is preferable in embodiments of the method of the present disclosure from the viewpoints of vapor pressure and ease of handling.

In embodiments of the method of the present disclosure for producing a lithium phosphorus oxynitride layer on a substrate by atomic layer deposition, preferably, each of $R_{21}$, $R_{22}$, $R_{23}$, $R_{24}$, $R_{25}$, and $R_{26}$ in the molecule represented by structural formula (II) as a second precursor, is a methyl group. The molecular is represented by the following structural formula.

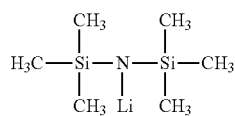

The second precursor represented by the aforementioned structural formula is so-called lithium hexamethyl disilazide (LiHMDS: $LiN(Si(CH_3)_3)_2$). This LiHMDS is preferable in embodiments of the method of the present disclosure from the viewpoint of vapor pressure and reactivity.

<Atmosphere Generation Step>

In embodiments of the method of the present disclosure for producing a lithium phosphorus oxynitride layer on a substrate by atomic layer deposition optionally comprises generating an atmosphere containing the first precursor or the second precursor.

A known step can be employed for generating an atmosphere containing the first precursor or the second precursor, without any particular limitations thereon. Examples of steps used to generate an atmosphere containing the first precursor or the second precursor may include a heating step, an electromagnetic wave irradiation step, and a combination thereof.

Although there are no particular limitations thereon, examples of the heating step may include a resistance heating step, electron beam heating step, high-frequency induction heating step, laser beam heating step, and combinations thereof.

Although there are no particular limitations thereon, examples of electromagnetic waves used in the electromagnetic wave irradiation step may include low-frequency or microwaves, infrared rays, visible light rays, ultraviolet light rays, X-rays, gamma rays and combinations thereof. Furthermore, in these steps, the first precursor or second precursor may be in the state of a gas and/or plasma.

Although there are no particular limitations thereon, examples of the temperature of the atmosphere containing the first precursor or the second precursor may be temperatures of 50° C. or higher, 70° C. or higher, 80° C. or higher, 90° C. or higher, or 100° C. or higher; and/or 500° C. or lower, 400° C. or lower, 350° C. or lower, 300° C. or lower, or 250° C. or lower.

The temperature of the first atmosphere containing the first precursor in the form of diethyl phosphoramidate is preferably 60° C. or higher, which is the melting point of diethyl phosphoramidate; more preferably 95° C. or higher, which is a temperature at which diethyl phosphoramidate vapors easily; and even more preferably 115° C. or higher, which is a temperature at which diethyl phosphoramidate vapors more easily.

The temperature of the second atmosphere containing the second precursor in the form of lithium hexamethyl disilazide is preferably 60° C. or higher from the viewpoint of ease of evaporation.

There are no particular limitations on the carrier gas of the first (or second) atmosphere containing the first (or second) precursor, provided that it is a gas that does not chemically react with the first (or second) precursor. Examples of carrier gases may be $N_2$ gas, He gas, Ar gas, or combinations thereof. In the case where the vapor pressure of a precursor is low, vaporization and/or sublimation of the precursor can be enhanced by the carrier gas.

Although there are no particular limitations thereon, examples of the pressure of the atmosphere containing the first precursor or the second precursor may be pressures of higher than 0 Pa, 100 Pa or higher, 200 Pa or higher, or 300 Pa or higher; and/or 10000 Pa or lower, 5000 Pa or lower, 1000 Pa or lower, or 500 Pa or lower.

<Substrate Temperature>

In embodiments of the method of the present disclosure for producing a lithium phosphorus oxynitride layer on a substrate by atomic layer deposition, the substrate temperature can optionally be a temperature of from about 250° C. to about 350° C.

Although there are no particular limitations thereon, examples of the temperature of the substrate on which the lithium phosphorus oxynitride layer is formed may be temperatures of 200° C. or higher, 230° C. or higher, 250° C. or higher, 270° C. or higher, or 290° C. or higher; and/or 400° C. or lower, 370° C. or lower, 350° C. or lower, 330° C. or lower, or 310° C. or lower. The temperature of the substrate on which the lithium phosphorus oxynitride layer is formed may be from about 250° C. to about 350° C. from the viewpoints of the formation of the layer having high ionic conductivity, low electronic conductivity and/or highly homogeneousness; and preferably from 330° C. to 350° C., from the viewpoints of the growth rate of the layer together with the above viewpoints.

Although there are no particular limitations thereon, examples of the duration of switching the atmosphere surrounding the substrate to a different atmosphere may be longer than 0.0 seconds, 1.0 seconds or longer, 1.5 seconds or longer, or 2 seconds or longer; and/or 1000 seconds or shorter, 500 seconds or shorter, 100 seconds or shorter, or 50 seconds or shorter.

Although there are no particular limitations thereon, examples of the pressure of the atmosphere surrounding the substrate may be pressures of greater than 0 Pa or higher, 100 Pa or higher, 200 Pa or higher, or 300 Pa or higher; and/or 10000 Pa or lower, 5000 Pa or lower, 1000 Pa or lower, or 500 Pa or lower.

<Purging Step>

In embodiments of the method of the present disclosure for producing a lithium phosphorus oxynitride layer on a substrate by atomic layer deposition, the atmosphere surrounding the substrate is preferably made to be an inert gas atmosphere during the time of switching between the first atmosphere and the second atmosphere.

As a result, excess first precursor or second precursor can be easily removed (purged) after having formed a layer of the first precursor or second precursor on the surface of the substrate. In addition, first (or second) precursor can be inhibited from reacting with remaining second (or first) precursor after this purging. Consequently, the amount of first precursor and second precursor used can be reduced, and layers can be accurately formed for each single layer.

There are no particular limitations on the inert gas, provided that it does not chemically react with the first precursor or second precursor. Inert gases indicated as examples of the aforementioned carrier gas can be used for the inert gas.

<Substrate>

The lithium phosphorus oxynitride layer is formed on the surface of the substrate.

There are no particular limitations on the substrate. Examples of substrates include a positive electrode active material layer and negative electrode active material layer contained in an all-solid-state battery. The following indicates raw materials contained in the positive electrode active material layer and negative electrode active material layer.

<Raw Materials Contained in Positive Electrode Active Material Layer>

The positive electrode active material layer contains a positive electrode active material, and optionally contains a conductive agent, binder, and solid electrolyte.

Although there are no particular limitations thereon, examples of positive electrode active materials may include a metal oxide comprising lithium and at least one type of transition metal selected from manganese, cobalt, nickel, and titanium, for examples, lithium cobalt oxide ($Li_xCoO_2$), lithium nickel cobalt manganese oxide ($Li_{1-x}Ni_{1/3}CO_{1/3}Mn_{1/3}O_2$) and the like, and combinations thereof.

Although there are no particular limitations thereon, examples of conductive agents may include carbon materials, such as vapor grown carbon fiber (VGCF), carbon black, Ketjen black, carbon nanofibers, and combinations thereof.

Although there are no particular limitations thereon, examples of binders may include polymer resins such as polyvinylidene fluoride (PVdF), butadiene rubber (BR), and combinations thereof.

Raw materials able to be used as solid electrolytes can be used for the solid electrolyte without any particular limitations. Examples of solid electrolytes may include sulfide-based amorphous solid electrolytes such as $75Li_2S$-$25P_2S_5$, oxide-based amorphous solid electrolytes such as $Li_2O$—$SiO_2$, crystalline oxides such as $Li_{1.3}Al_{0.3}Ti_{0.7}(PO_4)_3$, and combinations thereof.

<Raw Materials Contained in Negative Electrode Active Material Layer>

The negative electrode active material layer contains a negative electrode active material, and optionally contains a conductive agent, binder, and solid electrolyte.

There are no particular limitations on the negative electrode active material provided it is able to store and release metal ions such as lithium ions, and examples of carbon raw materials may include hard carbon, soft carbon, graphite, etc., and combinations thereof.

Raw materials indicated as examples relating to the positive electrode active material can be used as the conductive agent, binder, and solid electrolyte of the negative electrode active material layer.

Although the following provides a more detailed explanation of the present disclosure by referring to the examples indicated below, it goes without saying that the present disclosure is not limited by these examples.

EXAMPLES

Generation of Atmosphere Containing First Precursor or Second Precursor (Investigation of Vaporization Temperature of DEPA as First Precursor)

The vaporization temperature of the first precursor in the form of diethyl phosphoramidate (DEPA) was investigated by combining thermogravimetric (TG) measurement and differential scanning calorimetry (DSC), using the Model STA 449 F1 Jupiter Thermobalance manufactured by Netzsch GmbH.

Measurement conditions were as indicated below.
Pressure: 150 Pa (1.5 mbar)
Rate of temperature increase: 10° C./min
DEPA sample weight: 20 mg Furthermore, thermogravimetric measurement refers to a method whereby the weight of a target sample at a prescribed time is measured continuously while changing the temperature of the target sample in accordance with a predetermined protocol. The weight change of the target sample when vapored and/or sublimated, for example, can be determined using this measurement method.

In addition, differential scanning calorimetry refers to a method whereby the endothermic or exothermic behavior of a target sample is measured by measuring the temperature difference between the target sample and a reference sample when both are given the same amount of heat. A phase transition, for example, of a target sample can be determined using this measurement method.

The starting temperature of the vaporization of DEPA was determined to be in the vicinity of 95° C. based on the change in weight of a target sample as determined according to thermogravimetric measurement. In addition, the melting point of DEPA was determined to be 60° C. and the vaporization temperature was determined to be 115° C. based on the endothermic peak of a target sample as determined according to differential scanning calorimetry.

Example 1

Lithium Phosphorus Oxynitride Layer

<Preparation of Substrate>

A substrate in the form of a Si(100) and borosilicate substrate (12.25 cm$^2$: 3.5 cm×3.5 cm) was immersed in ethanol and cleaned in an ultrasonic bath.

<Preparation of First Atmosphere>

In addition, the temperature and pressure of a first atmosphere containing diethyl phosphoramidate (DEPA) as a first precursor and $N_2$ gas as a carrier gas were respectively maintained at about 87° C. and 150 Pa.

<Preparation of Second Atmosphere>

Moreover, the temperature and pressure of a second atmosphere containing lithium hexamethyl disilazide (LiHMDS) as a second precursor and $N_2$ gas as a carrier gas were respectively maintained at about 60° C. and 150 Pa.

<Preparation of Inert Gas Atmosphere>

Nitrogen gas ($N_2$) as an inert gas for purging was also prepared.

<Fabrication of Lithium Phosphorus Oxynitride Layer>

The aforementioned substrate was placed in a $F_{-120}$ Flow Type Hot-Wall ALD Reactor (ASM Microchemistry Ltd.), the pressure in the reactor was set to 500 Pa or less, and the temperature of the substrate was set to 230° C. Switching of the atmosphere surrounding the substrate was repeated for 1200 cycles, with one cycle (duration: 8 seconds) consisting of the aforementioned first atmosphere (2 seconds), an inert gas atmosphere (2 seconds), the aforementioned second atmosphere (2 seconds), and the inert gas atmosphere (2 seconds) in that order. As a result, a lithium phosphorus oxynitride layer was fabricated on the substrate.

Examples 2 to 7

Lithium Phosphorus Oxynitride Layer

The lithium phosphorus oxynitride layers of Examples 2 to 7 were fabricated in the same manner as the lithium phosphorus oxynitride layer of Example 1, with the exception of setting the substrate temperature to 250° C., 270° C., 290° C., 310° C., 330° C., or 350° C. during the aforementioned fabrication of a lithium phosphorus oxynitride layer.

Comparative Example

Lithium Phosphate Layer

The lithium phosphate layer of the comparative example was fabricated in the same manner as the lithium phosphorus oxynitride layer of Example 1, with the exception of using trimethyl phosphate $((CH_3)_3PO_4)$ as a first precursor, using lithium tert-butoxide $(LiOC(CH_3)_3)$ as a second precursor, and setting the substrate temperature to 330° C.

<<Evaluations>>

<Evaluation of Surface Status and Growth Rate of Lithium Phosphorus Oxynitride Layer>

The surface status and growth rate of the lithium phosphorus oxynitride layers were evaluated. The thicknesses of the lithium phosphorus oxynitride layers were measured by X-ray reflectrometry (XRR) using the X'Pert Pro Diffractometer equipped with a Cu-Kα X-ray source (Panalytical B.V.).

The substrate temperatures and surface status of the lithium phosphorus oxynitride layers of Examples 1 to 7 are shown in the following Table 1, and the relationship between substrate temperature (° C.) and growth rate (Å/cycle) of the lithium phosphorus oxynitride layers of Examples 2 to 7 is shown in FIG. 1.

TABLE 1

| | Substrate Temperature (° C.) | LiPON Layer Surface Status |
|---|---|---|
| Example 1 | 230 | Heterogeneous |
| Example 2 | 250 | Somewhat homogeneous |
| Example 3 | 270 | Homogeneous |
| Example 4 | 290 | Homogeneous |
| Example 5 | 310 | Homogeneous |
| Example 6 | 330 | Homogeneous |
| Example 7 | 350 | Homogeneous |

As shown in Table 1 and FIG. 1, the status of the surfaces of the lithium phosphorus oxynitride layers of Example 2 (250° C.) to Example 5 (310° C.) was comparatively homogeneous; Example 6 (330° C.) and Example 7 (350° C.) exhibited comparatively high homogeneity, and the growth rates of the lithium phosphorus oxynitride layers thereof were determined to be comparatively high. Furthermore, the growth rates of the lithium phosphorus oxynitride layer were stable between 270° C. and 310° C.

<Evaluation of Molecular Structure of Lithium Phosphorus Oxynitride Layer>

The molecular structures of the lithium phosphorus oxynitride layers of Examples 4 and 6 were evaluated. Evaluations were carried out by Fourier transform infrared spectroscopy (FT-IR) using the Nicolet *Magna* 750 Spectrophotometer (Thermo Scientific Corp.). The results are shown in FIG. 2.

Figure 2:
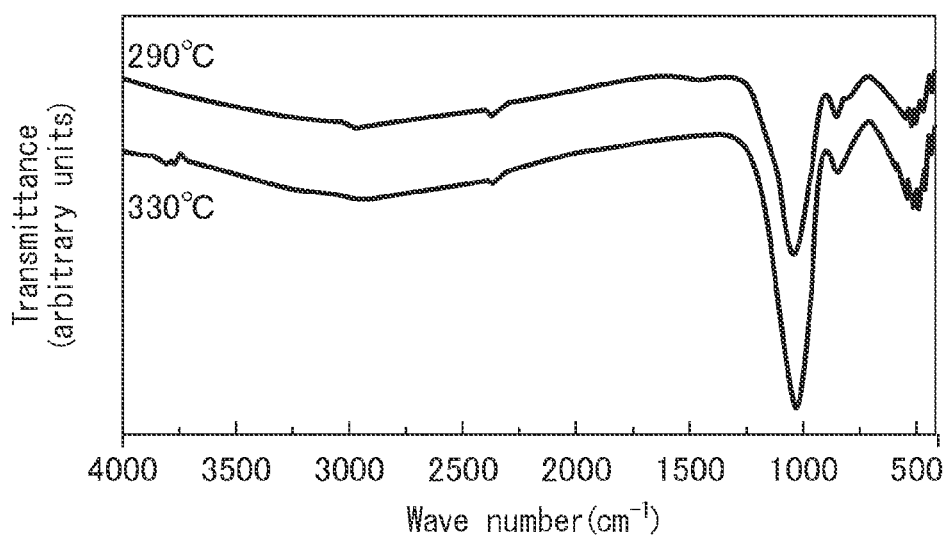
FIG. 2 is a graph showing the relationship between wave number ($cm^{-1}$) and transmittance (arbitrary units) of lithium phosphorus oxynitride layers formed at substrate temperatures of 290° C. and 330° C. according to one or more embodiments disclosed herein, which is measured by Fourier transform infrared spectroscopy (FT-IR).

FIG. 2 is a graph showing the relationship between wave number (cm$^{-1}$) and transmittance (arbitrary units) when having measured the lithium phosphorus oxynitride layers, formed at substrate temperatures of 290° C. (Example 4) and 330° C. (Example 6), by Fourier transform infrared spectroscopy.

On the basis of FIG. 2, the peak in the vicinity of 1000 cm$^{-1}$ was determined to consist mainly of the peak of P=O (1150 cm$^{-1}$), $PO_3$ (1050 cm$^{-1}$), and P—O—P/P—N—P (950 cm$^{-1}$). In addition, the peak at 850 cm$^{-1}$ was determined to be ascribed to the P—N bond, while the peak at 500 cm$^{-1}$ was determined to be ascribed to the Li—O—P bond. Moreover, a peak ascribed to the N—H bond of the first precursor in the form of DEPA was determined not to be essentially observed.

<Evaluation of Elemental Concentration of Lithium Phosphorus Oxynitride Layer>

Concentrations (at %) were evaluated for those elements (Li, P, N, O, and C) contained in the lithium phosphorus oxynitride layers of Examples 4 and 6. Concentrations were determined by nuclear reaction analysis (NRA) and Rutherford backscattering spectrometry (RBS) using the Pelletron 3SDH (National Electrostatics Corp.). The results are shown in the following Table 2.

TABLE 2

| | Substrate Temperature (° C.) | Concentration of Elements Contained in LiPON Layer (at %) | | | | |
|---|---|---|---|---|---|---|
| | | Li | P | N | O | C |
| Example 4 | 290 | 15.0 | 16.6 | 9.1 | 45.8 | 13.3 |
| Example 6 | 330 | 15.4 | 16.2 | 9.7 | 48.7 | 9.9 |

Furthermore, elemental Li was measured by nuclear reaction analysis. The measurement conditions are indicated below.

Target nuclear reaction: $^7\text{Li}(p,\alpha)^4\text{He}$
Ion source: $\text{H}^+$
Ion beam energy: 1.5 MeV
Scattering angle: 146°

In addition, the elemental concentrations of P, N, O and C were measured by Rutherford backscattering spectrometry. The measurement conditions are indicated below.

Ion source: $\text{He}^+$
Ion beam energy: 2.3 MeV
Scattering angle: 110°

Based on the ratios of the elements shown in Table 2 (Li, P, O, and N), the ratios of Li, P, O, and N of the lithium phosphorus oxynitride layers of Examples 4 and 6 were determined to be 0.90:1:2.75:0.55 and 0.95:1:3:0.6, respectively.

<Evaluation of Ionic Conductivity and Electronic Conductivity of Lithium Phosphorus Oxynitride Layer and the Like>

The ionic conductivity and electron conductivity of the lithium phosphorus oxynitride layers of Examples 4 and 6 and the ionic conductivity of the lithium phosphate layer of the comparative example were evaluated. Those conductivity was measured by electrochemical impedance spectroscopy (EIS) using the Autolab PGSTAT302N Potentiostat/Galvanostat (Metrohm Autolab GmbH).

The measurement conditions are indicated below.
Setting: Cross plane
Frequency range: 10 Hz to 200 kHz
Electrode: Gold electrode prepared by thermal deposition (0.04 cm$^2$: 0.2 cm×0.2 cm)
Atmosphere: Ar atmosphere (25° C.)

Furthermore, electronic conductivity of the lithium phosphorus oxynitride layers was determined by chronoamperometry using an applied voltage of 50 mV in addition to the measurement conditions described above.

Ionic conductivity of the lithium phosphorus oxynitride layers of Example 4 (290° C.) and Example 6 (330° C.) was $9.3\times10^{-8}$ (S/cm) and $6.6\times10^{-7}$ (S/cm), respectively. In addition, ionic conductivity of the lithium phosphate layer of the comparative example (330° C.) was $1.4\times10^{-10}$ (S/cm).

In addition, electronic conductivity of the lithium phosphorus oxynitride layers of Example 4 (290° C.) and Example 6 (330° C.) was $3.0\times10^{-12}$ (S/cm) and $3.0\times10^{-11}$ (S/cm), respectively.

Based on the above results, the ionic conductivities of the lithium phosphorus oxynitride layers of Examples 4 and 6 were determined to be at least 660 times the ionic conductivity of the lithium phosphate layer of the comparative example. In addition, the electronic conductivities of the lithium phosphorus oxynitride layers were determined to be sufficiently low. These results indicate that the lithium phosphorus oxynitride layer can be preferably employed as a solid electrolyte layer of a battery, and particularly an all-solid-state battery.

Furthermore, the lithium phosphate layer is described in Non-Patent Document 1 as having been fabricated using substrate temperatures of 250° C., 275° C., 300° C., and 325° C. Moreover, Non-Patent Document 1 indicates the maximum value of ionic conductivity of a lithium phosphate layer formed at a substrate temperature of 300° C., and that value is described as being $3.3\times10^{-8}$ (S/cm) at 26° C.

By comparing with the ionic conductivity of the lithium phosphate layer of Non-Patent Document 1, the ionic conductivity of the aforementioned lithium phosphorus oxynitride layer can be understood to be roughly 3 to 20 times higher.

However, according to the aforementioned results, the ionic conductivity of the lithium phosphorus oxynitride layer of Example 4 is lower than that of Example 6. Although this is not limited by any particular theory, it is believed to be due to an atmospheric component having entered during from the time of fabrication of the lithium phosphorus oxynitride layer to the time of measurement by electrochemical impedance spectroscopy (EIS), thereby resulting in the formation of $\text{Li}_2\text{CO}_3$ on the surface of the lithium phosphorus oxynitride layer of Example 4, and the ionic conductivity of this lithium phosphorus oxynitride layer having $\text{Li}_2\text{CO}_3$ formed on the surface thereof having lower ionic conductivity than the original lithium phosphorus oxynitride layer.

This being the case, since there is also the possibility of $\text{Li}_2\text{CO}_3$ having been formed on the surface of the lithium phosphorus oxynitride layer of Example 6 as well, the inherent ionic conductivity thereof has the potential to be even higher.

Furthermore, since a peak ascribed to $\text{Li}_2\text{CO}_3$ was not observed from the lithium phosphorus oxynitride layers of Examples 4 and 6 in the evaluation of the molecular structure of the lithium phosphorus oxynitride layer as previously described, $\text{Li}_2\text{CO}_3$ can be determined to have not been present on the surface of the lithium phosphorus oxynitride layer immediately following the fabrication thereof.

Although the above has provided a detailed description of preferred embodiments of the present disclosure, it can be understood by a person having ordinary skill in the art that apparatuses, chemicals, their manufacturers and grades, and the location and arrangement of the production line and the like employed in the method of the present disclosure can be modified without deviating from the scope of claim.

What is claimed is:

1. A method for producing a lithium phosphorus oxynitride layer on a substrate by atomic layer deposition, comprising:
an atmosphere interchanging step,
wherein the atmosphere surrounding the substrate is alternately switched between a first atmosphere, containing a first precursor, and a second atmosphere, containing a second precursor,
wherein the first precursor is at least one selected from the group consisting of molecules represented by the following structural formula (I-1) and (I-2) with $R_{11}$ and $R_{22}$ representing alkyl groups and $R_{13}$ representing an alkyl group, and

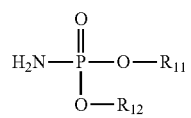

Structural Formula (I-1)

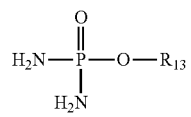

Structural Formula (I-2)

wherein the second precursor is at least one selected from the group consisting of an organic lithium amide molecule, an alkyl lithium molecule, and a lithium alkoxide molecule.

2. The method according to claim 1, wherein each of $R_{11}$ and $R_{12}$ in the structural formula (I-1) and $R_{13}$ in the structural formula (I-2) independently represent a methyl group, an ethyl group, a propyl group, a butyl group, or a pentyl group.

3. The method according to claim 1, wherein each of $R_{11}$ and $R_{12}$ in the structural formula (I-1) represent an ethyl group.

4. The method according to claim 1, wherein the second precursor is at least one selected from the group consisting of molecules represented by the following structural formula (II) with $R_{21}$, $R_{22}$, $R_{23}$, $R_{24}$, $R_{25}$, and $R_{26}$ representing alkyl groups, lithium tert-butoxide, lithiodicyclohexylamine, 2,2,6,6-tetramethyl-3,5-heptanedionato lithium, and lithium cyclopentadienide.

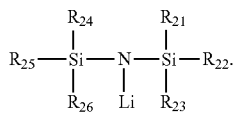

Structural Formula (II)

5. The method according to claim 4, wherein the first precursor is the molecules represented by the structural formula (I-1), and
wherein the second precursor is the molecules represented by the structural formula (II).

6. The method according to claim 4, wherein each of $R_{21}$, $R_{22}$, $R_{23}$, $R_{24}$, $R_{25}$, and $R_{26}$ in the structural formula (II) independently represent a methyl group, an ethyl group, a propyl group, a butyl group, or a pentyl group.

7. The method according to claim 4, wherein each of $R_{21}$, $R_{22}$, $R_{23}$, $R_{24}$, $R_{25}$, and $R_{26}$ in the structural formula (II) represent a methyl group.

8. The method according to claim 1, wherein temperature of the substrate is between about 250° C. to about 350° C.

9. The method according to claim 1, wherein the atmosphere surrounding the substrate is made to be an inert gas atmosphere during the time of switching between the first atmosphere and the second atmosphere.

10. The method according to claim 2, wherein each of $R_{11}$ and $R_{12}$ in the structural formula (I-1) represent an ethyl group.

11. The method according to claim 2, wherein the second precursor is at least one selected from the group consisting of molecules represented by the following structural formula (II) with $R_{21}$, $R_{22}$, $R_{23}$, $R_{24}$, $R_{25}$, and $R_{26}$ representing alkyl groups, lithium tert-butoxide, lithiodicyclohexylamine, 2,2,6,6-tetramethyl-3,5-heptanedionato lithium, and lithium cyclopentadienide.

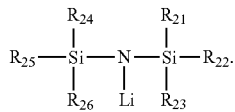

Structural Formula (II)

12. The method according to claim 3, wherein the second precursor is at least one selected from the group consisting of molecules represented by the following structural formula (II) with $R_{21}$, $R_{22}$, $R_{23}$, $R_{24}$, $R_{25}$, and $R_{26}$ representing alkyl groups, lithium tert-butoxide, lithiodicyclohexylamine, 2,2,6,6-tetramethyl-3,5-heptanedionato lithium, and lithium cyclopentadienide.

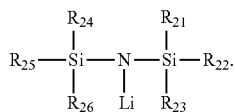

Structural Formula (II)

13. The method according to claim 5, wherein each of $R_{21}$, $R_{22}$, $R_{23}$, $R_{24}$, $R_{25}$, and $R_{26}$ in the structural formula (II) independently represents a methyl group, an ethyl group, a propyl group, a butyl group or a pentyl group.

14. The method according to claim 5, wherein each of $R_{21}$, $R_{22}$, $R_{23}$, $R_{24}$, $R_{25}$, and $R_{26}$ in structural formula (II) represents a methyl group.

15. The method according to claim 6, wherein each of $R_{21}$, $R_{22}$, $R_{23}$, $R_{24}$, $R_{25}$, and $R_{26}$ in structural formula (II) represents a methyl group.

16. The method according to claim 2, wherein temperature of the substrate is between about 250° C. to about 350° C.

17. The method according to claim 3, wherein temperature of the substrate is between about 250° C. to about 350° C.

18. The method according to claim 4, wherein temperature of the substrate is between about 250° C. to about 350° C.

19. The method according to claim 5, wherein temperature of the substrate is between about 250° C. to about 350° C.

20. The method according to claim 6, wherein temperature of the substrate is between about 250° C. to about 350° C.

* * * * *